United States Patent
Kim et al.

(10) Patent No.: US 10,988,131 B2
(45) Date of Patent: Apr. 27, 2021

(54) VEHICLE AND METHOD FOR CONTROLLING ENGINE STARTUP REFERENCE POWER

(71) Applicants: HYUNDAI MOTOR COMPANY, Seoul (KR); KIA MOTORS CORPORATION, Seoul (KR)

(72) Inventors: Sang Joon Kim, Seoul (KR); Young Chui Kim, Seongnam-si (KR); Leehyoung Cho, Suwon-si (KR); Dong Ho Yang, Incheon (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 268 days.

(21) Appl. No.: 15/996,772

(22) Filed: Jun. 4, 2018

(65) Prior Publication Data

US 2019/0202432 A1    Jul. 4, 2019

(30) Foreign Application Priority Data

Jan. 4, 2018  (KR) .......................... 10-2018-0000994

(51) Int. Cl.
*B60K 6/20*     (2007.10)
*B60W 20/13*    (2016.01)
(Continued)

(52) U.S. Cl.
CPC ............... *B60W 20/13* (2016.01); *B60K 6/20* (2013.01); *B60W 40/12* (2013.01);
(Continued)

(58) Field of Classification Search
CPC ....... B60K 6/20; B60L 2260/52; B60L 58/12; B60W 20/12; B60W 20/13; B60W 40/09;
(Continued)

(56) References Cited

U.S. PATENT DOCUMENTS 9,505,397 B1 * 11/2016 Brenner .............. B60L 15/2045
9,764,632 B2 *  9/2017 Yu ......................... B60W 20/13
(Continued)

FOREIGN PATENT DOCUMENTS

CN      105774797 A  *  7/2016
JP      2010089603 A  *  4/2010

OTHER PUBLICATIONS

Wagner et. al., "Beyond Mobility—An Energy Informatics Business Model for Vehicles in the Electric Age", 2013, Association for Information Systems, (Year: 2013).*

*Primary Examiner* — Anshul Sood
(74) *Attorney, Agent, or Firm* — Morgan, Lewis & Bockius LLP

(57) ABSTRACT

A plug-in hybrid electric vehicle (PHEV), which has an engine and a motor and travels using a power of the engine and an electric power of the motor, includes: a battery configured to supply a drive energy of the motor; a battery sensor configured to measure a state of charge (SOC) of the battery; and a controller configured to estimate an average mileage per cycle established using traveling information of the vehicle, estimate an average SOC per cycle using the measured SOC, and control a reference power needed for driving the engine according to the estimated average mileage and the estimated average SOC.

18 Claims, 10 Drawing Sheets

(51) Int. Cl.
*B60W 40/12* (2012.01)
*G01R 31/367* (2019.01)

(52) U.S. Cl.
CPC ..... *G01R 31/367* (2019.01); *B60W 2510/244* (2013.01); *B60W 2530/14* (2013.01); *B60Y 2200/92* (2013.01); *Y10S 903/903* (2013.01)

(58) Field of Classification Search
CPC ... B60W 2050/0089; B60W 2510/244; B60W 2530/14; B60W 2540/30; B60Y 2200/92; Y02T 10/62; Y02T 90/14
See application file for complete search history.

(56) References Cited

U.S. PATENT DOCUMENTS

| | | | |
|---|---|---|---|
| 2009/0277701 A1* | 11/2009 | Soma | B60L 50/16 |
| | | | 180/65.25 |
| 2012/0197468 A1* | 8/2012 | Frederick | B60W 10/26 |
| | | | 701/22 |
| 2016/0244044 A1* | 8/2016 | Miller | B60W 10/06 |
| 2019/0001959 A1* | 1/2019 | Schlumpp | B60W 50/0097 |

\* cited by examiner

FIG. 5

| DAY | MON. | TUES. | WED. | THURS. | FRI. | SAT. | SUN. | HOLIDAY |
|---|---|---|---|---|---|---|---|---|
| AVERAGE MILEAGE PER DAY | 151km | 148km | 163.5km | 146km | 152km | 70km | 142km | 120km |

FIG. 6

| DAY | MON. | TUES. | WED. | THURS. | FRI. | SAT. | SUN. | HOLIDAY |
|---|---|---|---|---|---|---|---|---|
| AVERAGE SOC PER DAY | P1 | P2 | P3 | P4 | P5 | P6 | P7 | P8 |

VEHICLE AND METHOD FOR CONTROLLING ENGINE STARTUP REFERENCE POWER

CROSS-REFERENCE TO RELATED APPLICATION

This application claims the benefit of priority to Korean Patent Application No. 10-2018-0000994, filed on Jan. 4, 2018 in the Korean Intellectual Property Office, the disclosure of which is incorporated herein by reference.

TECHNICAL FIELD

The present disclosure relates to a vehicle and a method for controlling the same.

BACKGROUND

A vehicle can be classified into an internal combustion vehicle (general engine vehicle), a hybrid electric vehicle, and a fuel cell electric vehicle (FCEV) according to power sources for generating driving force.

The hybrid electric vehicle includes a motor and an internal combustion engine, drives on the road using mechanical power of the engine and electric power of the motor, and operates the motor using a battery.

A driving mode of the hybrid vehicle may be classified into three modes, i.e., an electric vehicle (EV) mode, a hybrid electric vehicle (HEV) mode, and an auto mode. During the EV mode, the hybrid vehicle is driven only using electric power of the motor. During the HEV mode, the hybrid vehicle is driven using a combination of engine power and electric power of the motor. During the auto mode, the hybrid vehicle is driven by properly distributing engine power and electric power of the motor.

While state of charge (SOC) of the battery of the hybrid vehicle is variably controlled by engine operation based on a driving state, the engine operation is dynamically changed, such that it is impossible for the hybrid vehicle to immediately reflect the driving state into SOC control of the battery. In order to address this issue, an improved plug-in hybrid electric vehicle (PHEV) has recently been developed.

The PHEV has a relatively larger battery capacity than a conventional HEV, such that the PHEV has a higher degree of freedom than the conventional HEV in terms of fuel efficiency control, and the PHEV can be controlled in various ways using the larger battery capacity and higher degree of freedom. For example, when the PHEV travels a short distance within a commuting distance, the PHEV can charge a high-voltage battery with external power, such that the PHEV may travel in the EV mode or a charge depleting (CD) mode. During middle-distance or long-distance traveling of the PHEV, the PHEV may generally enter the auto mode so that the PHEV is driven in the auto mode in which engine power and motor power are properly distributed until reaching a destination, resulting in optimum efficiency of the PHEV. Typically, when a requested power is considered high on the basis of a requested power level or torque during the auto mode, the PHEV may use the engine. When a requested power is considered low on the basis of a requested power level or torque during the auto mode, the PHEV may be controlled to select a power source having a maximum instantaneous efficiency using electric power.

After a destination is first established, the PHEV may guarantee a control performance in the auto mode using information associated with the destination. After the destination is established, the PHEV may receive a distance from a navigation system to the destination as an input, may control a power source during the auto mode, may change a reference power needed for engine startup according to the distance to the destination, and may reduce the engine startup reference power in proportion to the increasing distance to the destination.

However, when a driver drives the PHEV on a favorite route or the like, the driver may frequently forget to set a destination so that the PHEV is unable to recognize a distance to the destination and it is impossible for the engine startup reference power to be changed according to the distance to the destination, resulting in reduction of fuel efficiency and difficulty in control performance during the auto mode.

SUMMARY

An aspect of the present disclosure provides a vehicle for guaranteeing control performance of an auto mode by estimating an average mileage of the vehicle driven by a driver without establishing a destination, and a method for controlling the same.

Additional aspects of the invention will be set forth in part in the description which follows and, in part, will be obvious from the description, or may be learned by practice of the invention.

In accordance with an aspect of the present disclosure, in a plug-in hybrid electric vehicle (PHEV) having an engine and a motor, and traveling using a power of the engine and an electric power of the motor, the vehicle includes a battery configured to supply a drive energy of the motor; a battery sensor configured to measure a state of charge (SOC) of the battery; and a controller configured to estimate an average mileage per cycle established using traveling information of the vehicle, estimate an average SOC per cycle using the measured SOC, and control a reference power needed for driving the engine according to the estimated average mileage and the estimated average SOC.

The average mileage per cycle may be an average mileage per day, and the average SOC per cycle may be an average SOC per day.

The controller may estimate substantial All Electric Range (AER) by converting the estimated average SOC into a mileage value.

The controller may select a driving mode by comparing the estimated average mileage with the substantial AER.

The driving mode may include: an electric vehicle (EV) mode in which the vehicle is driven only using the electric power a hybrid electric vehicle (HEV) mode in which the vehicle is driven using a combination of the engine power and the electric power according to the measured SOC; and an auto mode in which the vehicle is driven using distribution of the engine power and the electric power according to the measured SOC.

The controller may monitor a driver's traveling pattern according to the estimated average mileage and the estimated SOC during the auto mode, and may thus variably control the reference power for driving the engine.

The controller may reduce an engine startup request power reference value needed to drive the engine in proportion to the increasing estimated average mileage.

The controller may increase the engine startup request power reference value in proportion to the reducing estimated average mileage.

The controller may reduce the engine startup request power reference value in proportion to the reducing estimated average SOC.

The controller may increase the engine startup request power reference value in proportion to the increasing estimated average SOC.

In accordance with another aspect of the present disclosure, a vehicle configured to drive using a power of an engine and an electric power of a motor includes: a battery configured to supply a drive energy of the motor; a battery sensor configured to measure a State of Charge (SOC) of the battery; and a controller configured to estimate an average mileage per cycle established using traveling information of the vehicle, estimate an average SOC per cycle using the measured SOC, and control a reference power needed for driving the engine during an auto mode according to the estimated average mileage and the estimated average SOC, wherein the controller estimates an All Electric Range (AER) by converting the estimated average SOC into a mileage value, and changes the reference power by comparing the estimated average mileage with the estimated substantial AER.

In accordance with another aspect of the present disclosure, a method for controlling a vehicle that includes an engine, a motor, and a battery, and drives using an engine power and an electric power of the motor includes: measuring, by a battery sensor, an SOC of the battery; estimating, by a controller, an average mileage per cycle established using traveling information of the vehicle; estimating, by the controller, an average SOC per cycle using the measured SOC; and controlling, by the controller, a reference power needed for driving the engine according to the estimated average mileage and the estimated average SOC, wherein the step of controlling the reference power includes: estimating an All Electric Range (AER) by converting the estimated average SOC into a mileage value; and controlling the reference power by comparing the estimated average mileage with the estimated AER.

The method may further include: selecting a driving mode by comparing the estimated average mileage with the estimated substantial AER.

The controlling the engine startup reference power may include: monitoring a driver's traveling pattern according to the estimated average mileage and the estimated SOC during the auto mode, and thus variably controlling the engine startup reference power.

The variably controlling the engine startup reference power may include: reducing an engine startup request power reference value needed to drive the engine in proportion to the increasing estimated average mileage; and increasing the engine startup request power reference value in proportion to the increasing estimated average mileage.

BRIEF DESCRIPTION OF THE DRAWINGS

These and/or other aspects of the invention will become apparent and more readily appreciated from the following description of the embodiments, taken in conjunction with the accompanying drawings:

FIG. 5 is a view illustrating an average mileage per day in a vehicle driven by a driver.

FIG. 6 is a view illustrating an average SOC per day in a vehicle driven by a driver.

DETAILED DESCRIPTION

Figure 1:
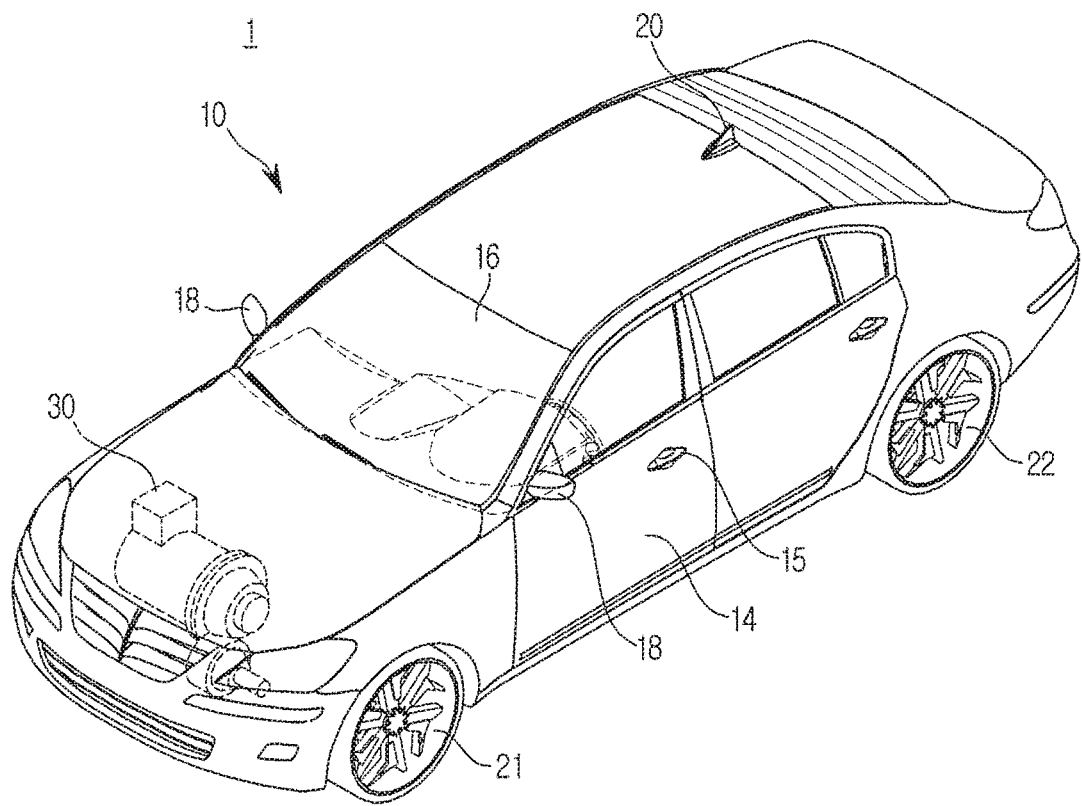
FIG. 1 is a view illustrating an appearance of a vehicle according to an embodiment of the present disclosure.

Reference will now be made in detail to the embodiments of the present disclosure, examples of which are illustrated in the accompanying drawings, wherein like reference numerals refer to like elements throughout.

The terms used in the present application are merely used to describe specific embodiments and are not intended to limit the present disclosure. A singular expression may include a plural expression unless otherwise stated in the context. In the present application, the terms "including" or "having" are used to indicate that features, numbers, steps, operations, components, parts or combinations thereof described in the present specification are present and presence or addition of one or more other features, numbers, steps, operations, components, parts or combinations is not excluded.

In description of the present disclosure, the terms "first" and "second" may be used to describe various components, but the components are not limited by the terms. The terms may be used to distinguish one component from another component. For example, a first component may be called a second component and a second component may be called a first component without departing from the scope of the present disclosure. The term "and/or" may include a combination of a plurality of items or any one of a plurality of items.

A vehicle and method for controlling the same according to an embodiment of the present disclosure will hereinafter be described with reference to the attached drawings.

FIG. 1 is a view illustrating the appearance of a vehicle according to an embodiment of the present disclosure.

Referring to FIG. 1, a vehicle 1 according to an embodiment includes a body 10 forming the appearance of the vehicle 1, doors 14 to shield an indoor space of the vehicle 1 from the outside, a windshield 16 to provide a forward view of the vehicle 1 to a vehicle driver who rides in the vehicle 1, side-view mirrors 18 to provide a rear view of the vehicle 1 to the vehicle driver, vehicle wheels 21 and 22 to move the vehicle 1 from place to place, and a driving device 30 to rotate the vehicle wheels 21 and 22.

The doors 14 are rotatably provided at the right and left sides of the body 10 so that a vehicle driver can ride in the vehicle 1 when any of the doors 14 is open and an indoor space of the vehicle 1 can be shielded from the outside when the doors 14 are closed. The doors 14 may be locked or unlocked by door handles 15. The door handles 15 may be locked or unlocked by the vehicle driver who directly operates a button or lever by approaching the vehicle 1, or may be remotely locked or unlocked by a remote controller, etc. at a remote site distant from the vehicle 1.

The windshield 16 is provided at a front upper portion of the body 10 so that a vehicle driver who rides in the vehicle 1 can obtain visual information of a forward direction of the vehicle 1. The windshield 16 may also be referred to as a windshield glass.

The side-view mirrors 18 may include a left side-view mirror provided at the left of the body 10 and a right side-view mirror provided at the right of the body 10, so that the driver who rides in the vehicle 1 can obtain visual information of the lateral and rear directions of the vehicle 1.

Besides, the vehicle 1 may include an antenna 20 provided at a top surface of the body 10.

The antenna 20 may receive broadcast/communication signals, for example, telematics signal, DMB signal, digital TV signal, GPS signal, etc. The antenna 20 may be a multi-functional antenna configured to receive various kinds of broadcast/communication signals, or may be a single functional antenna configured to receive any one of broadcast/communication signals.

The wheels 21 and 22 may include front wheels 21 provided at the front of the body 10 and rear wheels 22 provided at the rear of the body 10. The driving device 30 may provide rotational force to the front wheels 21 or the rear wheels 22 in a manner that the body 10 moves forward or backward. The driving device 30 may include an engine 300 (see FIG. 3) to generate rotational force by burning fossil fuels or a motor 30 to generate rotational force upon receiving power from a battery 200 (see FIG. 3).

The vehicle 1 may include the engine 300 (see FIG. 3), the battery 200 (see FIG. 3), and the motor 30 (see FIG. 3), and may be a plug-in hybrid electric vehicle (PHEV) configured to travel on the road using mechanical power of the engine 300 and electric power of the motor 30. The PHEV is a vehicle that is driven simultaneously using power of the internal combustion engine 300 and electric power of the battery 200 while being driven using electric power of the battery 200 charged with electricity received from the external part.

Figure 2:
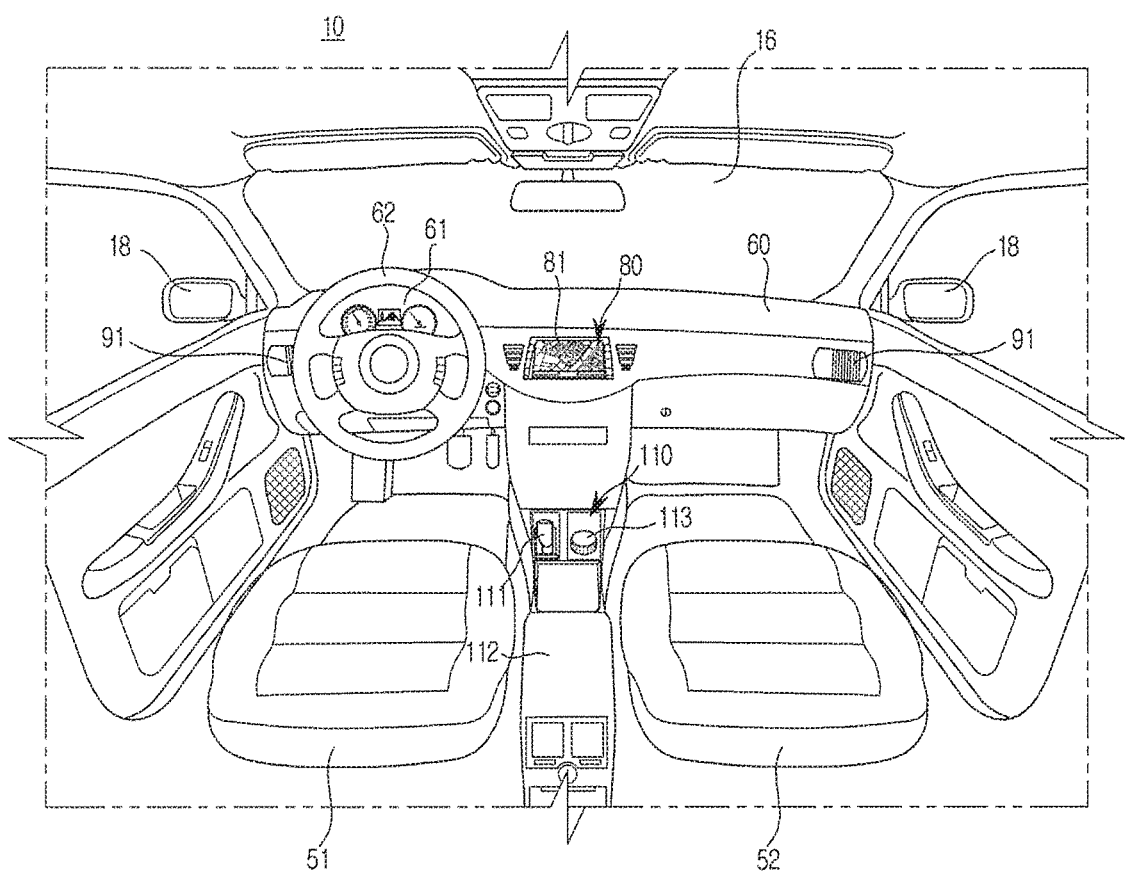
FIG. 2 is a view illustrating an internal structure of the vehicle according to an embodiment of the present disclosure.

FIG. 2 is a view illustrating an internal structure of the vehicle 1 according to an embodiment of the present disclosure.

Referring to FIG. 2, the indoor space of the vehicle 1 may include seats 51 and 52 on which passengers of the vehicle 1 sit, a steering wheel 62 mounted to the driver seat 51 on which a driver from among the passengers sits, a cluster 61 mounted to a front portion of the body 10 from the steering wheel 62 and displaying operation information of the vehicle 1, and a dashboard 60 to which various devices connected to the cluster 61 to manipulate the vehicle 1 are mounted.

In more detail, the dashboard 60 may protrude from a lower portion of the windshield 16 toward the seats 51 and 52, such that the vehicle driver who looks forward can manipulate various devices mounted to the dashboard 60.

For example, various devices mounted to the dashboard 60 may include an audio video navigation (AVN) device 80 mounted to a center fascia corresponding to the center region of the dashboard 60, an air outlet 91 of an air conditioner 90 (see FIG. 3) mounted to a side surface of a touchscreen 81 of the AVN device 80, and various input devices mounted to a lower portion of the AVN device 80.

The AVN device 80 may perform an audio function, a video function, and a navigation function according to manipulation of the passenger, and may be connected to a controller (i.e., a head unit) for controlling the vehicle 1.

The AVN device 80 may also perform two or more functions as necessary. For example, the AVN device 80 may reproduce music recorded on a CD or USB by turning on the audio function, and at the same time may perform the navigation function. In addition, the AVN device 80 may display DMB images by turning on the video function, and at the same time may perform the navigation function.

The AVN device 80 may display a screen image related to the audio function, a screen image related to the video function, or a screen image related to the navigation function on the touchscreen 81. The touchscreen 81 may display a charging state (SOC) of the electric vehicle 1.

The touchscreen 81 may be implemented by any one of a Liquid Crystal Display (LCD) panel, a Light Emitting Diode (LED) panel, an Organic Light Emitting Diode (OLED) panel, etc. without being limited thereto. The touchscreen 81 may perform a screen display function and an input function of instructions or commands.

The touchscreen 81 may output a screen image including predetermined images to the outside according to an operating system (OS) for driving/controlling the AVN device 80 and an application being executed in the AVN device 80, or may receive instructions or commands.

The touchscreen 81 may display a basic screen image according to the executed application. If touch manipulation is not performed, the touchscreen 81 may display the basic screen image.

The touchscreen 81 may also display a touch manipulation screen image according to situations. The touch manipulation screen may indicate a screen image capable of receiving the user's touch manipulation.

The touchscreen 81 may be any one of a resistive touchscreen which senses the user's touch manipulation by recognizing pressure, a capacitive touchscreen which senses the user's touch manipulation based on the effect of capacitive coupling, an optical touchscreen based on infrared light, or an ultrasonic touchscreen which uses ultrasound, without being limited thereto.

The touchscreen 81 may control the AVN device 80 embedded in the vehicle 1 to interact with the user, and may receive a user command through touch interaction or the like. Since characters or menus displayed on the touchscreen 81 are selected, the touchscreen 81 may receive a user command as an input.

In this case, the AVN device 80 may be referred to as a navigation terminal or a display device, and may also be referred to by various terms well known to those skilled in the art as necessary.

In addition, the AVN device 80 may include a Universal Serial Bus (USB) port, and the like, may be connected to communication terminals, for example, a smartphone, a Portable Multimedia Player (PMP), an MPEG Audio Layer-3 (MP3) player, a Personal Digital Assistants (PDA), etc., and may reproduce audio and video files as necessary.

The air outlet 91 of the air conditioner 90 may be provided to both sides of the touchscreen 81 of the dashboard 60. The air conditioner 90 may automatically control the air-conditioning environment (including indoor/outdoor environmental conditions of the vehicle 1, air intake/exhaust process, air circulation, cooling/heating, etc.), or may control the air-conditioning environment in response to a control command of the user.

For example, the air conditioner 90 may perform heating and cooling of the air, and may discharge the heated or cooled air through the air outlet 91, thereby controlling a temperature of the indoor space of the vehicle 1.

The driver or passenger may control the air conditioner 90 to adjust the temperature of the internal space of the body 10, before the driver or passenger gets in the vehicle 1.

The interior part of the vehicle 1 may include a center console 110 disposed between the seats 51 and 52, and a tray 112 connected to the center console 110. The center console 110 may include a gear lever 111 and a jog-wheel or various key-types of input buttons 113, without being limited thereto.

Figure 3:
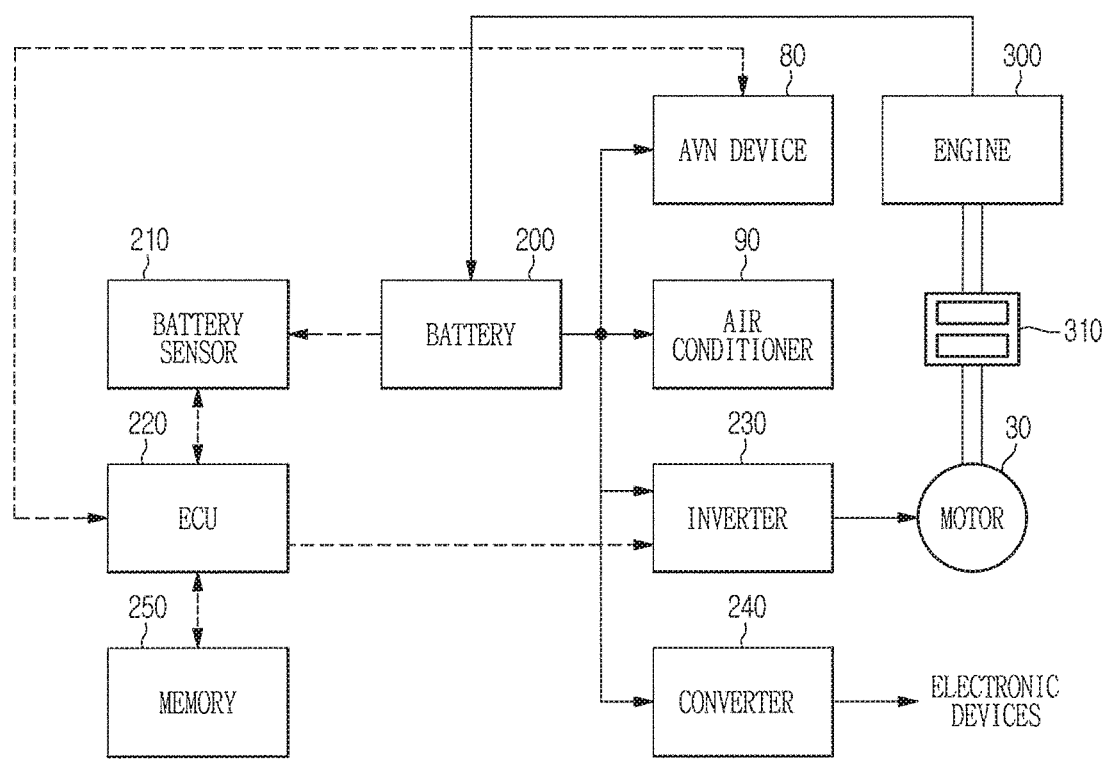
FIG. 3 is a block diagram illustrating the vehicle according to an embodiment of the present disclosure.

FIG. 3 is a block diagram illustrating the vehicle according to an embodiment of the present disclosure.

Referring to FIG. 3, the vehicle 1 may include not only constituent elements shown in FIGS. 1 and 2, but also a battery 200, a battery sensor 210, a controller 220, an inverter 230, a converter 240, a memory 250, an engine 300, and a clutch 310.

Dotted arrows shown among the controller 220, the AVN device 80, the battery 200, the inverter 230, and the memory 250 may denote flow of control signals transmitted through a Controller Area Network (CAN), and solid arrows shown among the battery 200, the air conditioner 90, the inverter 230, the converter 240, and the motor 30 may denote flow of electric power supplied from the battery 200.

The battery 200 may be implemented as a high-voltage battery, which may store electrical energy generated by rotational force of the engine 300, and may supply power to various electronic devices embedded in the vehicle 1. For example, during driving of the vehicle 1, a generator may convert rotational energy of the engine 300 into electrical energy, and the battery 200 may receive electrical energy from the generator and store the received electrical energy therein. In order to allow the vehicle 1 to travel on the road, the battery 200 may supply power for starting the engine 300 to a starter motor, or may supply power to electronic devices embedded in the vehicle 1.

The battery 200 may store power supplied from an external charger (not shown) therein.

Power stored in the battery 200 may be used as drive energy of the motor 30.

A battery sensor (BS) 210 mounted to the battery 200 may measure state information of the battery 200, i.e., SOC of the battery 200, and may output the measured battery state information (SOC) to the controller 220. For example, the battery sensor 210 may measure the residual voltage and current of the battery 200, and may output the measured voltage and current to the controller 220.

The battery sensor 210 may measure a voltage, current, and temperature of the battery 200, and may measure SOC of the battery 200, State of Health (SOH) of the battery 200, and State of Function (SOF) of the battery 200 according to the measured result. Battery charging state information (i.e., voltage, current, SOC, SOF, temperature, etc.) measured by the battery sensor 210 may be transmitted to the controller 220 through LIN communication.

SOC may indicate a difference in percentage (%) between a current 200 and a fully-charged battery, and may be identical in concept to a fuel gauge of the vehicle 1 including an internal combustion engine.

SOH may indicate a difference between the current battery 200 and a new battery.

SOF may indicate how much performance of the battery 200 is matched with actual requirements during the usage time of the battery 200, such that the SOF may be decided based on an SOC, an SOH, a battery 200's operation temperature, and a charging/discharging history.

The controller 220 may be used as a processor configured to control overall operation of the vehicle 1, and may be a processor of an electronic control unit (ECU) configured to control overall operation of a power system. The controller 220 may control various modules and devices embedded in the vehicle 1. In accordance with one embodiment, the controller 220 may generate a control signal for controlling various modules and devices embedded in the vehicle 1, such that the controller 220 may control operations of constituent elements using the control signal.

The controller 220 may use a Controller Area Network (CAN) of the vehicle 1. The CAN may refer to a network system to perform communication between electronic control units (ECUs) of the vehicle 1 as well as to control the ECUs. In more detail, the CAN may transmit data through a pair of twisted data lines or a pair of shield data lines shielded with a covering material. The CAN may operate according to multi-master principles in which each ECU for use in master/slave systems may operate as a master. The controller 220 may also perform data communication either through an in-vehicle wired network (for example, a Local Interconnect Network (LIN), Media Oriented System Transport (MOST). etc. of the vehicle 1) or through a wireless network such as a Bluetooth network.

The controller 220 may include a memory to store programs for performing the aforementioned and following operations and various kinds of data associated with the programs, a processor to execute the programs stored in the memory, and a hydraulic control unit (HCU), a microcontroller unit (MCU), etc. each of which acts as a hydraulic control device. The controller 220 may be integrated into a System On Chip (SOC) embedded in each vehicle 1, and may operate by the processor. However, one or more SOCs may be embedded in the vehicle 1, and the scope or spirit of the present disclosure is not limited to only one SOC.

The controller 220 may be implemented as at least one of a flash memory type, a hard disk type, a multimedia card micro type, a card type memory (e.g. a Secure Digital (SD) memory or an eXtreme Digital (XD) memory), a Random Access Memory (RAM), a Static Random Access Memory (SRAM), a Read Only Memory (ROM), an Electrically Erasable Programmable Read Only Memory (EEPROM), a Programmable Read Only Memory (PROM), a magnetic memory, a magnetic disk, an optical disc, etc. However, the scope or spirit of the controller 220 according to the present disclosure is not limited thereto, and may also be implemented as another format well known to those skilled in the art.

In accordance with one embodiment, the controller 220 may control the power source in consideration of a driving style (e.g., a favorite driving pattern) of a driver of the PHEV 1 on the condition that the driver controls the PHEV 1 to travel in the auto mode without establishing the destination. A method for controlling the auto mode in consideration of the driving pattern (i.e., traveling pattern) of the driver according to the embodiments of the present disclosure will hereinafter be described with reference to FIGS. 4 to 9.

In accordance with one embodiment, the controller 220 may monitor SOC of the battery 200 through the battery sensor 210, and may calculate an EV available range of the vehicle 1 according to an SOC level.

Therefore, the controller 220 may variably control the engine startup reference power without establishing the destination on the basis of the average mileage and average battery SOC per cycle (i.e., per day) established according to the driver's traveling pattern.

The controller 220 may display an SOC of the battery 200 and an estimated charge time of the battery 200 on a navigation screen image, and may control the battery 200 to be charged.

An inverter 230 may convert a voltage of the battery 200 into multiphase AC power (also called polyphase AC power), for example, 3-phase (composed of U-phase, V-phase, and W-phase) AC power, and may provide the multiphase AC power to the motor 30. To this end, a control signal for controlling a format of multiphase AC power produced by the inverter 230 may be applied to the inverter 230.

The motor 30 may be driven by multiphase AC power of the inverter 230 so as to generate power (rotational force). The rotational force of the motor 30 may be used to rotate front wheels 21 or rear wheels 22 of the vehicle 1.

The converter 240 may step up (boost) or step down (reduce) DC power received from the battery 200 by a predetermined level. DC power generated from the converter 240 may be supplied to various electronic devices, e.g., lamps, controllers, multimedia devices, etc., embedded in the vehicle 1.

In accordance with one embodiment, the converter 240 may power on the touchscreen 81 (see FIG. 2) embedded in the vehicle 1 such that multimedia information (i.e., a navigation screen image) is provided to a user (driver) through the touchscreen 81.

The memory 250 may store data or software/firmware needed when the controller 220 performs control. Specifically, the memory 250 may store a navigation schedule (or running schedule) of the vehicle 1, a setting temperature of the air conditioner 90, SOC information of the battery 200, etc.

Although the memory 250 may be implemented as any one of a non-volatile memory (e.g., a cache, a Read Only Memory (ROM), a Programmable ROM (PROM), an Erasable Programmable ROM (EPROM), an Electrically Erasable Programmable ROM (EEPROM), a flash memory, etc.), a volatile memory (e.g., a Random Access Memory (RAM)), and a storage medium (e.g., a Hard Disk Drive (HDD), a CD-ROM, etc.), the scope or spirit of the present disclosure is not limited thereto. The memory 250 may be a memory that is implemented as a separate chip independent of the controller 220, or may be implemented as a processor and a single chip.

The engine 300 may generate mechanical power by burning fossil fuels such as gasoline or diesel, and may transmit the generated power to the clutch 310.

The clutch 310 may be disposed between the engine 300 and the motor 30.

The clutch 310 may be closed or locked when driving power of the wheels 21 and 22 is generated using the engine 300 and the motor 30. When driving power of the wheels 21 and 22 is generated only using the motor 310, a spring (not shown) is pressed by hydraulic pressure generated by driving of a Hydraulic Clutch Actuator (HCA), so that the clutch 310 may be opened.

That is, an open or closed state of the clutch 310 may be decided according to the driving mode of the vehicle 1. In more detail, the clutch 310 may be opened when the vehicle travels in an acceleration mode or a low-speed mode using the motor 30. The clutch 310 may also be opened during braking of the vehicle 1. During a climbing mode, an acceleration mode, or a cruise control mode of more than a constant speed, the clutch 310 may be closed. In addition, during a protection mode of the battery 200, the clutch 310 may also be closed.

The clutch 310 may be a normal-close-type clutch in a manner that the engine 300 is connected to the motor 30 when the vehicle 1 is powered off.

In accordance with one embodiment, a power source of the vehicle 1 may construct a parallel structure in which the engine 300 and the motor 30 are simultaneously connected to an axle of the vehicle 1 such that the engine 300 and the motor 30 can simultaneously drive the vehicle 1.

The vehicle 1 may open the clutch 310 when driving in the EV mode only using the motor 30 in a manner that the motor 30 is not mechanically connected to the engine 300 and rotational force of the motor 30 can be immediately transmitted to a transmission. In this case, the engine 300 is in a drive-OFF state. During charging of the battery 200, the engine 300 may be in a drive-ON state.

When the vehicle 1 drives in the HEV mode by simultaneous operation of the engine 300 and the motor 30, the vehicle 1 may close the clutch 310, so that rotational force of the engine 300 is added to rotational force of the motor 30 and the added result is then transmitted to the transmission.

Since the engine must be connected to the axle even when the vehicle 1 is driven only using the engine 300, the clutch 310 is closed in a manner that the engine 300 can rotate along with the motor 30.

In accordance with one embodiment, the AVN device 80 may interact with the air conditioner 90 so that the AVN device 80 may display various control screen images associated with control of the air conditioner 90 on the touchscreen 81. The AVN device 80 may adjust the air conditioning environment in the indoor space of the vehicle 1 by controlling an operation state of the air conditioner 90. The AVN device 80 may allow the driver who rides in the vehicle 1 to establish a desired destination through the touchscreen 81, and may allow the driver to view a map on which a route to the destination is displayed.

The AVN device 80 may include the touchscreen 81 for displaying various kinds of information indicating a current state of the vehicle 1, for example, a navigation screen, an audio screen, a state of the air conditioner 90, etc. The touchscreen 81 may display an EV available range of the vehicle 1, a charging station search, a battery SOC, etc. such that the touchscreen 81 may display information needed when the battery 200 of the vehicle 1 is driven by the user or driver. The EV available range may display a maximum range in which the vehicle 1 can travel at a current SOC of the battery 200. The charging station search may provide the user or driver with the position of a charging station located in a peripheral region of the vehicle 1. The battery SOC may denote the SOC of the battery 200 as a percentage (%).

The touchscreen 81 may display a charging time indicating a start time of charging the battery 200 and a charging time setting menu through which the user can change the charging start time.

In accordance with one embodiment, the touchscreen 81 may display a user setting screen image of the navigation in a manner that the driver can establish a desired destination using the touchscreen 81.

The driving mode of the vehicle (i.e., PHEV) 1 may be classified into an EV mode, an HEV mode, and an AUTO mode.

The EV mode may denote a driving mode in which the vehicle 1 is driven only using the electric power of the motor 30. When the driver-requested power is higher than the maximum electric power, the vehicle may use the engine power. Therefore, the EV mode is made available only when the SOC of the high-voltage battery 200 is equal to or higher than a predetermined value.

During the EV mode, the vehicle is driven using only the electric power, such that the vehicle generates less noise and is comfortable to drive in. Moreover, when the vehicle drives a short distance in which the vehicle can drive in the EV mode after being charged with electricity, superior fuel efficiency can be acquired.

During the HEV mode (i.e., Charge Sustaining (CS) mode), the vehicle is driven using a combination of the engine power and the electric power of the motor 30, the vehicle may use the same power distribution method as in the conventional HEV. Therefore, the HEV mode may use only a specific range (HEV level) of the SOC band, instead of using the entire range of the high-voltage battery 200.

The vehicle is driven using a combination of the engine power and the electric power during the HEV mode. Therefore, the HEV mode is the most efficient driving mode when the SOC of the high-voltage battery 200 is in the SOC region in which the vehicle is unable to enter the EV mode.

During the auto mode, the engine power and the electric power are properly distributed in consideration of a driving situation so as to implement high fuel efficiency in the high-voltage battery 200's SOC in which the vehicle can enter the EV mode. During the auto mode, the vehicle can sufficiently use the battery SOC until reaching the destination after the destination has been established, such that the vehicle can further increase fuel efficiency until reaching the SOC in which the EV mode is released.

The auto mode may allow the vehicle to drive at superior fuel efficiency when the vehicle drives a long distance on the condition that the vehicle cannot drive in the EV mode.

If necessary, not only the EV mode, the HEV mode, and the auto mode, but also other appropriate operation modes (e.g., a mandatory charging mode, etc.) may also be used according to characteristics of the vehicle 1.

Typically, the vehicle drives a short distance in the EV mode (CD mode). During the EV mode, the controller 220 may set a requested power amount at which the vehicle starts operation only using the engine 300, to the maximum power (Max Power) of the electric power obtained from the motor 30.

The vehicle 1 may switch to the HEV mode (CS mode). When the vehicle 1 drives in the CS mode, the controller 220 may set the engine power at which the engine 300 starts operation to a low-level engine power.

Assuming that the PHEV has a plan (for example, a start SOC of 90% and an arrival SOC of 20%) to reduce SOC of the battery 200 while traveling to the destination, the PHEV may have the best fuel efficiency by linearly reducing the battery SOC according to an optimum resultant distance based on the dynamic programming technique. A detailed description thereof will hereinafter be described with reference to FIG. 4.

Figure 4:
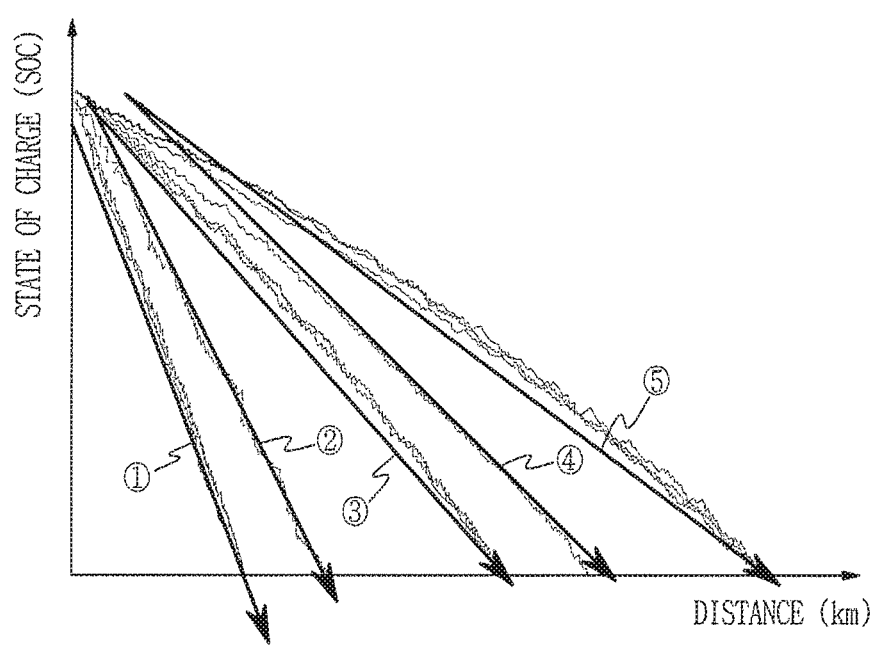
FIG. 4 is a graph illustrating state of charge (SOC) of a battery based on a distance to a destination.

FIG. 4 is a graph illustrating State of Charge (SOC) of a battery based on a distance to a destination.

As can be seen from FIG. 4, it is assumed that slope ② has a longer distance to the destination as compared to slope ①. Likewise, the distance to the destination increases in the order of ①→②→③→④→⑤. That is, slope ① shows the shortest distance to the destination, and slope ⑤ shows the longest distance to the destination.

For example, slope ① illustrates an exemplary case in which the slope of the battery SOC is sharply reduced, such that the vehicle is driven in the EV mode. Slope ① illustrates that the slope of the battery SOC is gradually reduced in proportion to the increasing distance to the destination such that it can be recognized that the vehicle 1 automatically enters the EV mode or the HEV mode according to a state of the vehicle 1.

Therefore, the engine start time for driving the engine 300 may be changeable in a manner that SOC of the battery 200 is gradually reduced in proportion to the increasing distance to the destination. In other words, the operation for properly using the engine power is considered effective in terms of fuel efficiency, such that it may be possible to recognize such high fuel efficiency on the basis of the fact that the requested reference power needed to drive the engine 300 is gradually reduced in proportion to the increasing distance to the destination. In order to perform the above-mentioned control, there is a need to recognize the distance to the destination. However, when the driver desires to use a favorite route, the driver can easily drive his or her vehicle to a destination without setting the destination in the AVN device 80 (i.e., the navigation system) of the vehicle. In this case, the AVN device 80 does not recognize the distance to the destination, such that it is impossible to differentially control the engine driving start time according to the respective destinations, and it is also impossible to maximize fuel efficiency during the auto mode.

In order to obviate the above-mentioned issues, the embodiment of the present disclosure provides a method for statistically processing a per-cycle (e.g., per-day or per-time zone) traveling distance (mileage) established according to the driver's traveling pattern, and estimating the distance to an approximate destination without establishing the destination, thereby achieving differential engine driving control on the basis of the estimated distance. A detailed description thereof will hereinafter be described with reference to FIGS. 5 to 9.

FIG. 5 is a view illustrating an average mileage per day in a vehicle driven by a driver.

Referring to FIG. 5, the controller 220 may statically process the per-day or per-time zone average mileage of the vehicle driven by the driver, such that the controller 220 may estimate the average mileage of the driver driven by the driver based on the processed result.

In this case, the method for estimating the average mileage of the vehicle driven by the driver may be implemented by arithmetically averaging traveling distances (mileages) of different days of the week, or may be implemented by fixing a constant number of buffers and then deleting the oldest data when the number of data pieces is higher than the number of buffers.

FIG. 6 is a view illustrating an average SOC per day in a vehicle driven by a driver.

Referring to FIG. 6, the controller 220 may statically process the average battery SOC per day of the vehicle driven by the driver, such that the controller 220 may estimate potential battery available energy and substantial All Electric Range (AER). AER may denote EV (Electric Vehicle) traveling distance (mileage) acquired when the vehicle 1 is driven in the EV mode (CD mode).

In this case, the method for estimating the average battery SOC and the substantial AER of the vehicle driven by the driver may be carried out in the same manner as in the method for estimating the average mileage of the vehicle driven by the driver, or may be used to estimate the substantial AER by converting the average SOC into the mileage.

Here, the controller 220 may store a reference AER table based on the SOC of the battery 200. Therefore, when the vehicle 1 starts driving, the controller 220 may measure the SOC of the battery 200 using the battery sensor 210, and may establish a reference AER based on the initial SOC by referring to the reference AER table.

As described above, the controller 220 may estimate the average mileage per day and the average battery SOC per day of the vehicle driven by the driver, such that the controller 220 may variably control the reference value of the engine startup request power during the auto mode. A detailed description thereof will hereinafter be described with reference to FIGS. 7 and 8.

Figure 7:
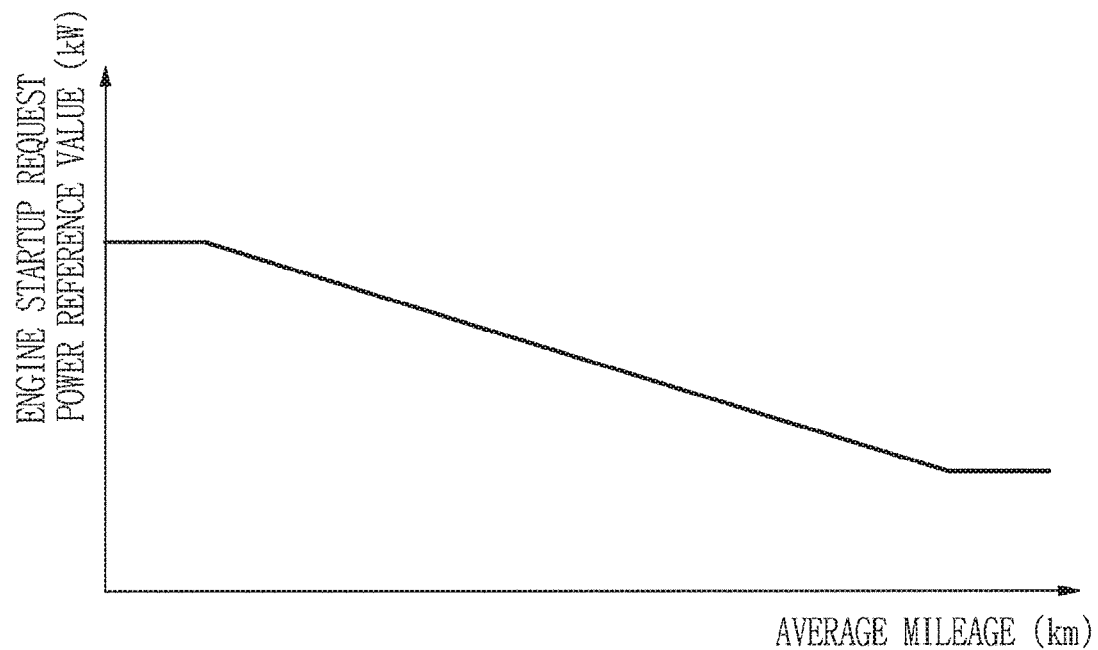
FIG. 7 is a graph illustrating a reference value of an engine startup request power based on an estimated average mileage.

FIG. 7 is a graph illustrating a reference value of an engine startup request power based on an estimated average mileage.

Referring to FIG. 7, the controller 220 may change the reference value of the engine startup request power according to the estimated average mileage of the vehicle driven by the driver.

The controller 220 may relatively reduce the reference value of the engine startup request power in proportion to the increasing estimated mileage, such that the engine driving start time is reduced and the vehicle 1 may more quickly switch from the EV mode (CD mode) to the HEV mode (CS mode).

The controller 220 may relatively increase the reference value of the engine startup request power in proportion to the reducing estimated mileage, such that the engine driving start time is increased and the vehicle 1 may more slowly switch from the EV mode (CD mode) to the HEV mode (CS mode).

Figure 8:
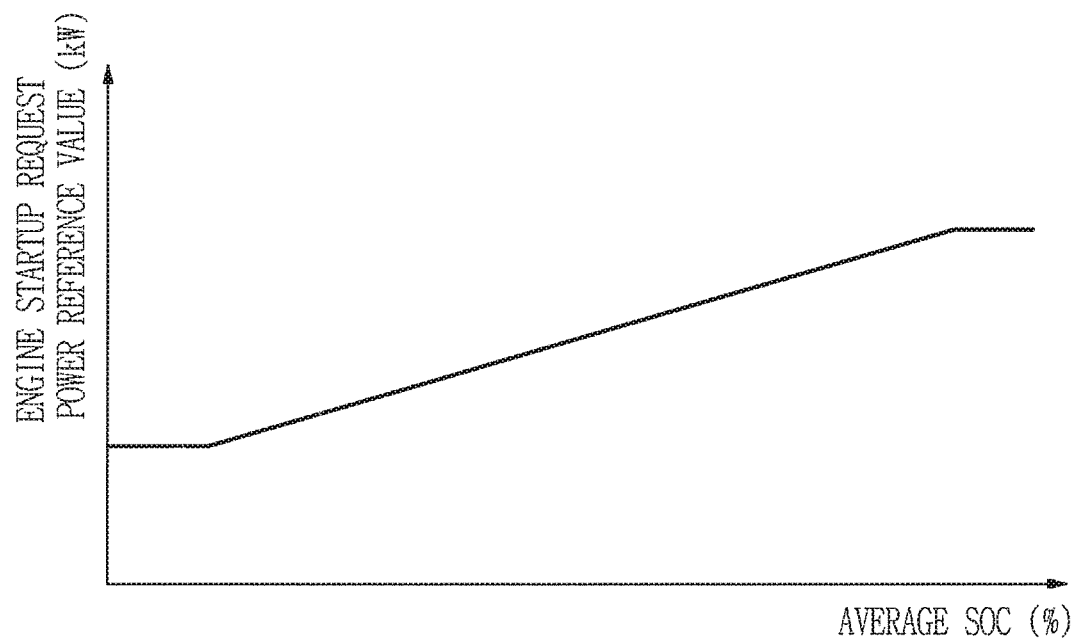
FIG. 8 is a graph illustrating a reference value of an engine startup request power based on an estimated SOC.

FIG. 8 is a graph illustrating a reference value of the engine startup request power based on the estimated SOC.

Referring to FIG. 8, the controller 220 may change the reference value of the engine startup request power according to the estimated average SOC of the vehicle driven by the driver.

The controller 220 may relatively increase the reference value of the engine startup request power in proportion to the increasing estimated SOC, such that the engine driving start time is increased and the vehicle 1 may more slowly switch from the EV mode (CD mode) to the HEV mode (CS mode).

The controller 220 may relatively reduce the reference value of the engine startup request power in proportion to the reducing estimated SOC, such that the engine driving start time is reduced and the vehicle 1 may more quickly switch from the EV mode (CD mode) to the HEV mode (CS mode).

In accordance with one embodiment, the controller 220 may change the reference value of the engine startup request power in the auto mode, not only using the estimated average mileage per day of the vehicle driven by the driver but also using the estimated average SOC per day of the vehicle driven by the driver. A detailed description thereof will hereinafter be described with reference to FIG. 9.

Figure 9:
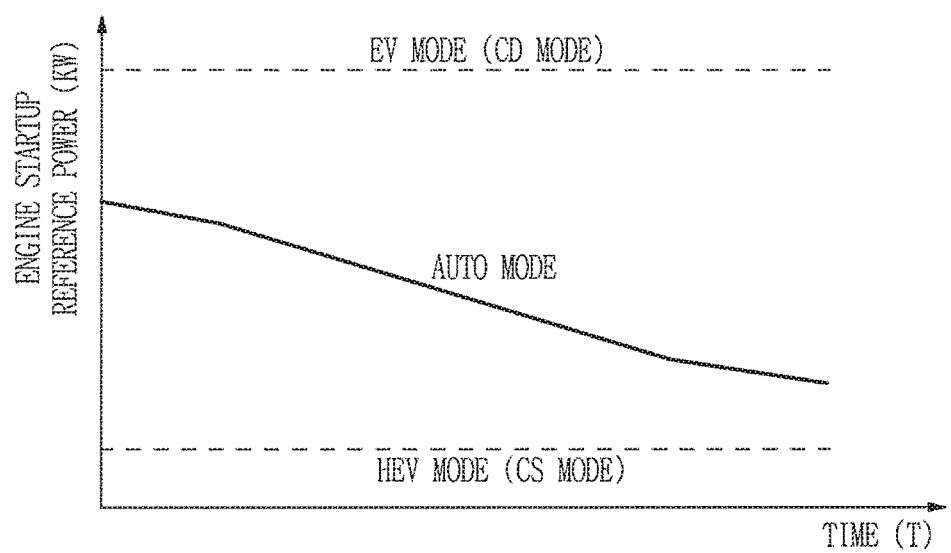
FIG. 9 is a graph illustrating engine startup reference power based on an estimated average mileage and an estimated average SOC.

FIG. 9 is a graph illustrating an engine startup reference power based on an estimated average mileage and an estimated average SOC.

Referring to FIG. 9, the controller 220 may perform statistical processing according to different days of the week, and may change the engine startup reference power in the range between one engine startup reference power (motor maximum power) of the EV mode (CD mode) and the other engine startup reference power of the HEV mode (CS mode), not only using the estimated average mileage per day of the vehicle driven by the driver but also using the estimated SOC (energy) per day of the vehicle driven by the driver.

Operations and effects of the vehicle and the method for controlling the same according to the embodiment of the present disclosure will hereinafter be described.

Figure 10:
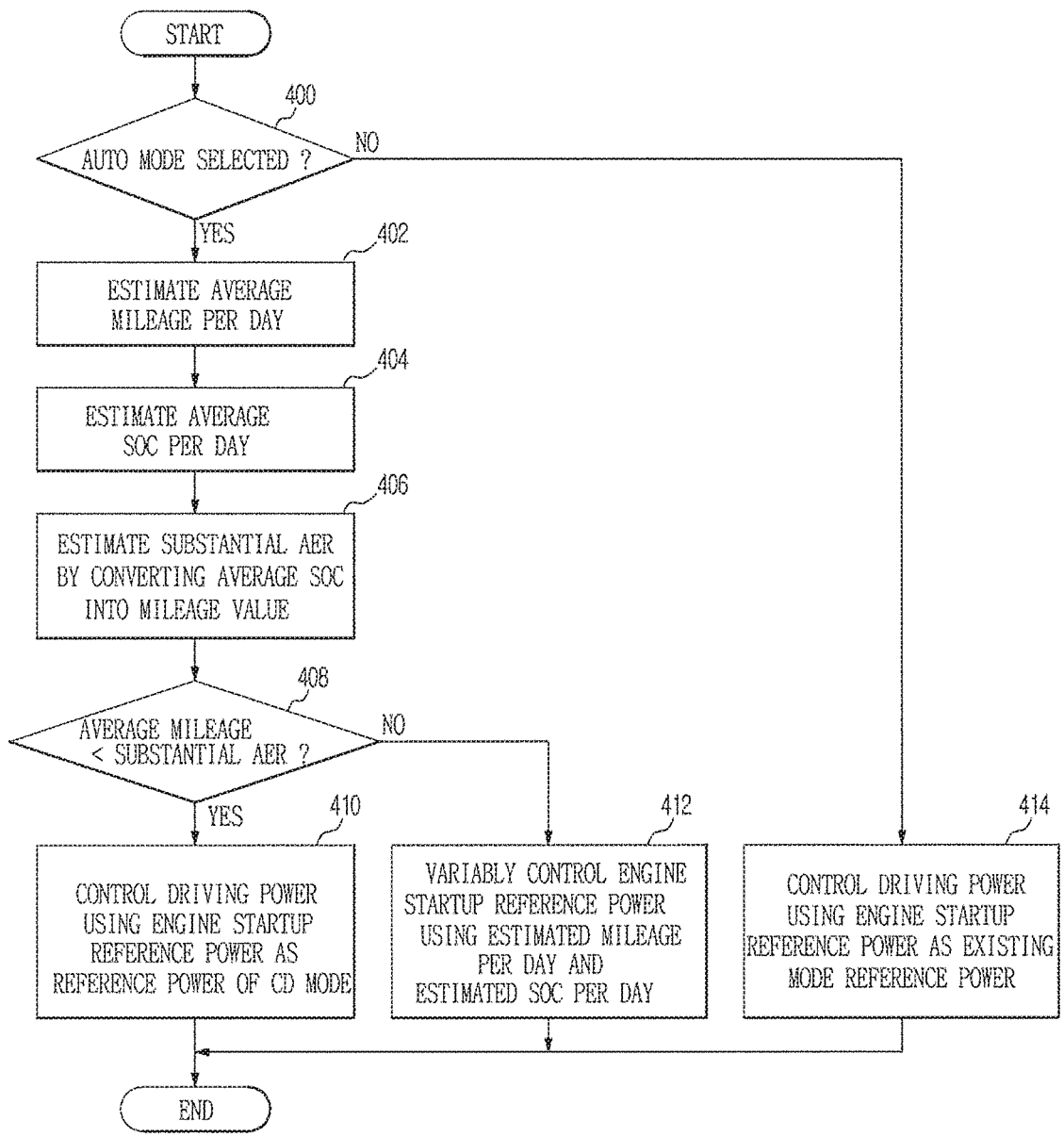
FIG. 10 is a flowchart illustrating an auto mode control algorithm of the vehicle according to an embodiment of the present disclosure.

FIG. 10 is a flowchart illustrating an auto mode control algorithm of the vehicle according to an embodiment of the present disclosure.

Referring to FIG. 10, when the vehicle 1 starts driving, the controller 220 may determine whether the driver selects the auto mode as a driving mode (400).

When the auto mode is selected (400), the controller 220 may estimate the average mileage by statically processing the average mileage per day of the vehicle driven by the driver (402).

As can be seen from FIG. 6, the controller 220 may estimate the potential battery available energy by statically processing the average SOC per day of the vehicle driven by the driver (404), and may estimate the substantial AER by converting the estimated SOC into the mileage (406).

Therefore, the controller 220 may compare the estimated average mileage with the substantial AER, and may determine whether the average mileage is shorter than the substantial AER (408).

When the average mileage is shorter than the substantial AER (408), the controller 220 may determine that the vehicle can travel by the estimated average mileage only using electric power, such that the controller 220 may control driving power of the engine startup reference power using the EV mode (CD mode) as reference power as shown in FIG. 9 (410). Driving power control based on the EV mode (CD mode) may be achieved centering upon the electric power source. When the average mileage is shorter than the substantial AER, the above-mentioned driving power control may control the engine power to be used.

When the average mileage is not shorter than the substantial AER (408), the controller 220 may determine that the vehicle 1 can travel by the estimated average mileage by properly distributing the electric power and the engine power. As illustrated in FIG. 9, the controller 220 may change the engine startup reference power not only using the estimated mileage per day but also using the estimated SOC per day, thereby controlling driving power (412). Driving power control based on the auto mode may be achieved by estimating the distance to the approximate destination without setting the destination, such that the vehicle 1 may be controlled to use the engine power while simultaneously consuming total energy of the high-voltage battery 200 until the vehicle 1 reaches the estimated average mileage.

When the auto mode is not selected (400), the controller 220 may control the driving power using the engine startup reference power as the reference power of the existing driving mode, thereby controlling the driving power (414).

As described above, the controller 220 may statistically process the average mileage per day and the average SOC per day of the vehicle driven by the driver according to the driver's traveling pattern without establishing the destination by the driver, and may variably control the reference power value of the engine driving start time, resulting in maximum fuel efficiency of the auto mode.

As is apparent from the above description, a vehicle and a method for controlling the same according to the embodiments of the present disclosure may estimate an average mileage of a PHEV driven by a driver who rides in the PHEV by monitoring a traveling pattern of the PHEV driven by the driver. As a result, the vehicle and the method for controlling the same according to the embodiments may variably control the engine startup reference power using the estimated average mileage without estimating a destination, resulting in maximum fuel efficiency and guarantee of control performance of the auto mode. Therefore, the vehicle and the method for controlling the same according to the embodiments may increase system efficiency upon controlling the auto mode for middle-distance or long-distance traveling, resulting in increased driver satisfaction and guaranteed product competitiveness.

Although a few embodiments of the present disclosure have been shown and described, it would be appreciated by those skilled in the art that changes may be made in these embodiments without departing from the principle and spirit of the invention, the scope of which is defined in the claims and their equivalents.

What is claimed is:

1. A plug-in hybrid electric vehicle (PHEV) having an engine and a motor, and traveling using a power of the engine and an electric power of the motor, the vehicle comprising:
    a battery configured to supply a drive energy of the motor;
    a battery sensor configured to measure a state of charge (SOC) per cycle of the battery; and
    a controller configured to:
        estimate an average mileage per cycle established using traveling information of the vehicle,
        estimate an average SOC per cycle using the SOC per cycle, and
        control a reference power needed for driving the engine according to the average mileage per cycle and the average SOC per cycle,
    wherein the controller estimates an All Electric Range (AER) by converting the average SOC per cycle into a mileage value, and
    wherein the controller selects one of a plurality of driving modes by comparing the average mileage per cycle with the AER.

2. The vehicle according to claim 1, wherein the average mileage per cycle is an average mileage per day, and the average SOC per cycle is an average SOC per day.

3. The vehicle according to claim 1, wherein the plurality of driving modes include:
    an electric vehicle (EV) mode in which the vehicle is driven only using the electric power;
    a hybrid electric vehicle (HEV) mode in which the vehicle is driven using a combination of the engine power and the electric power according to the SOC per cycle; and
    an auto mode in which the vehicle is driven using distribution of the engine power and the electric power according to the SOC per cycle.

4. The vehicle according to claim 3, wherein the controller monitors a driver's traveling pattern according to the average mileage per cycle and the average SOC per cycle during the auto mode, and variably controls the reference power for driving the engine.

5. The vehicle according to claim 4, wherein the controller reduces the reference power for driving the engine in proportion to the average mileage per cycle as the average mileage per cycle increases.

6. The vehicle according to claim 4, wherein the controller increases the reference power in proportion to the average mileage per cycle as the average mileage per cycle decreases.

7. The vehicle according to claim 4, wherein the controller reduces the reference power in proportion to the average SOC per cycle as the average SOC per cycle decreases.

8. The vehicle according to claim 4, wherein the controller increases the reference power in proportion to the average SOC per cycle as the average SOC per cycle increases.

9. A vehicle configured to drive using a power of an engine and an electric power of a motor, the vehicle comprising:
    a battery configured to supply a drive energy of the motor;
    a battery sensor configured to measure a state of charge (SOC) per cycle of the battery; and
    a controller configured to:
        estimate an average mileage per cycle established using traveling information of the vehicle;
        estimate an average SOC per cycle using the-SOC per cycle; and
        control a reference power needed for driving the engine during an auto mode according to the average mileage per cycle and the average SOC per cycle,
    wherein the controller estimates an All Electric Range (AER) by converting the average SOC per cycle into a mileage value, compares the average mileage per cycle with the estimated AER, and adjusts the reference power according to a comparison result.

10. The vehicle according to claim 9, wherein the controller reduces the reference power needed to drive the engine in proportion to the average mileage per cycle as the average mileage per cycle increases.

11. The vehicle according to claim 9, wherein the controller increases the reference power in proportion to the average mileage per cycle as the average mileage per cycle decreases.

12. The vehicle according to claim 9, wherein the controller reduces the reference power in proportion to the average SOC per cycle as the average SOC per cycle decreases.

13. The vehicle according to claim 9, wherein the controller increases the reference power in proportion to the increasing average SOC per cycle as the average SOC per cycle increases.

14. A method for controlling a vehicle that includes an engine, a motor, and a battery, and drives using an engine power and an electric power of the motor, the method comprising steps of:
    measuring, by a battery sensor, a state of charge (SOC) per cycle of the battery;
    estimating, by a controller, an average mileage per cycle established using traveling information of the vehicle;
    estimating, by the controller, an average SOC per cycle using the SOC per cycle; and
    controlling, by the controller, a reference power needed for driving the engine according to the average mileage per cycle and the average SOC per cycle,
    wherein the step of controlling the reference power includes:
        estimating an All Electric Range (AER) by converting the average SOC per cycle into a mileage value; and
        controlling the reference power by comparing the average mileage per cycle with the estimated AER.

15. The method according to claim 14, further comprising selecting a one of a plurality of driving modes by comparing the average mileage per cycle with the estimated AER.

16. The method according to claim 15, wherein the plurality of driving modes include:
    an electric vehicle (EV) mode in which the vehicle is driven only using the electric power;
    a hybrid electric vehicle (HEV) mode in which the vehicle is driven using a combination of the engine power and the electric power according to the SOC per cycle; and
    an auto mode in which the vehicle is driven using distribution of the engine power and the electric power according to the SOC per cycle.

17. The method according to claim 16, wherein the step of controlling the reference power includes monitoring a driver's traveling pattern according to the average mileage per cycle and the average SOC per cycle during the auto mode, and variably controlling the reference power.

18. The method according to claim 17, wherein the variably controlling the reference power includes:
reducing the reference power needed to drive the engine in proportion to the average mileage per cycle as the average mileage per cycle increases; and
increasing the reference power in proportion to the average SOC per cycle as the average SOC per cycle increases.

\* \* \* \* \*